(12) United States Patent
Fujii

(10) Patent No.: US 6,831,307 B2
(45) Date of Patent: Dec. 14, 2004

(54) SEMICONDUCTOR MOUNTING SYSTEM

(75) Inventor: Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/374,818

(22) Filed: Feb. 25, 2003

(65) Prior Publication Data

US 2003/0178638 A1 Sep. 25, 2003

(30) Foreign Application Priority Data

Mar. 19, 2002 (JP) ..................................... P2002-075818

(51) Int. Cl.$^7$ ...................... H01L 29/73; H01L 23/495; H01L 23/12; H01L 21/461; H01L 21/302
(52) U.S. Cl. ...................... 257/180; 257/181; 257/676; 257/711; 257/E33.05; 438/692; 438/747; 216/88; 216/90
(58) Field of Search ............................... 438/692, 747; 216/88, 90; 279/128

(56) References Cited

U.S. PATENT DOCUMENTS

| | | | | |
|---|---|---|---|---|
| 5,886,863 A | * | 3/1999 | Nagasaki et al. | 361/234 |
| 5,958,794 A | * | 9/1999 | Bruxvoort et al. | 438/692 |
| 6,104,596 A | * | 8/2000 | Hausmann | 361/234 |
| 6,108,189 A | * | 8/2000 | Weldon et al. | 361/234 |
| 6,108,190 A | * | 8/2000 | Nagasaki | 361/234 |
| 6,134,096 A | * | 10/2000 | Yamada et al. | 361/234 |
| 6,215,643 B1 | * | 4/2001 | Nagasaki | 361/234 |
| 6,239,402 B1 | * | 5/2001 | Araki et al. | 219/121.4 |
| 6,268,994 B1 | * | 7/2001 | Logan et al. | 361/234 |
| 6,280,584 B1 | * | 8/2001 | Kumar et al. | 204/298.15 |
| 6,370,007 B2 | * | 4/2002 | Takahasi et al. | 361/234 |
| 6,483,690 B1 | * | 11/2002 | Nakajima et al. | 361/234 |
| 6,490,146 B2 | * | 12/2002 | Wang et al. | 361/234 |
| 6,494,955 B1 | * | 12/2002 | Lei et al. | 118/715 |
| 6,538,872 B1 | * | 3/2003 | Wang et al. | 361/234 |

FOREIGN PATENT DOCUMENTS

| | | | |
|---|---|---|---|
| EP | 745456 | * | 5/1995 |
| JP | 6-263552 | * | 9/1994 |

OTHER PUBLICATIONS

U.S. Appl. No. 10/623,052, filed Jul. 18, 2003, Fujii et al.

* cited by examiner

*Primary Examiner*—Long Pham
*Assistant Examiner*—Shrinivas H. Rao
(74) *Attorney, Agent, or Firm*—Burr & Brown

(57) ABSTRACT

An object of the present invention is to provide a novel semiconductor mounting system having a semiconductor mounting member, a metal member and a joining layer joining the mounting and metal members, to improve the flatness of a mounting surface and to control the temperature on the surface of a semiconductor. A semiconductor mounting system 12 has a semiconductor mounting member 1, a metal member 7 and a joining layer 27 joining the mounting member 1 and metal member 7. The metal member 1 has a surface mounting a semiconductor. The adhesive sheet 4 has a resin matrix 11 and a filler 10 dispersed in the resin matrix 11.

7 Claims, 6 Drawing Sheets

SEMICONDUCTOR MOUNTING SYSTEM

This application claims the benefit of Japanese Patent Application P 2002-75, 818 filed on Mar. 19, 2002, the entirety of which is incorporated by reference.

BACKGROUND OF THE INVENTION

1. Field of the Invention

The present invention relates to a semiconductor mounting system.

2. Related Art Statement

In a semiconductor processing such as CVD, sputtering and etching, a semiconductor wafer is mounted on a so-called susceptor, which is then heated to carry out the heat treatment of the wafer. It has been known that an electrostatic chuck made of a ceramic material is used as a susceptor for adsorbing a semiconductor wafer and heated for subjecting the wafer to a heat treatment. It is, however, necessary to reduce the temperature change during the adsorption-desorption cycles of semiconductor wafers on a susceptor, for further improving the production of the semiconductor wafers. It is therefore needed to control and switch the heating and cooling of the wafer with a reduced time delay. The necessity of controlling the heating-cooling cycle demands a cooling system connected with the susceptor.

In Japanese Patent Publication 287, 344A/1992), paste of an adhesive composition made of silicone resin is used to join a susceptor and a metal cooling flange. Further in Japanese patent publication 45, 757A/1997, a susceptor and a metal cooling board is joined with indium metal.

SUMMARY OF THE INVENTION

When indium or adhesive resin composition is used for joining a ceramic electrostatic chuck and a water cooling flange of a metal, however, an insufficient pressure during the joining process may reduce the flatness of the adsorption face of the chuck for a semiconductor wafer. When a semiconductor wafer is processed, the wafer is adsorbed onto the adsorption face of the electrostatic chuck. The chuck having an adsorption face with a deteriorated flatness may thus not be used and the production yield may be reduced. Further, back side gas is supplied over the surface of an electrostatic chuck in many cases, it is difficult to maintain the air-tightness of the joining portion between the chuck and metal member. Thermal cycles are applied on a semiconductor production system. It is particularly needed to maintain the air-tightness of the joining portion at excellent reliability after the thermal cycles. On the contrary, if the pressure during the joining process is too high, the adhesive composition may be out of the joining portion flown along the interface between the chuck and cooling flange. Further, the thickness of the adhesive layer may not be uniform or changed in different articles. In this case, the thermal conductivity between the semiconductor mounting and metal members may be changed to reduce the production yield.

Further, an adhesive of silicone resin composition does not have an elongation sufficient for relaxing the thermal stress to induce warping or peeling of the joining face after the joining process.

An object of the present invention is to provide a novel semiconductor mounting system having a semiconductor mounting member, a metal member and a joining layer joining the mounting and metal members, to improve the flatness of a semiconductor mounting surface and to enable the temperature control of a semiconductor surface.

The present invention provides a semiconductor mounting system having a semiconductor mounting member with a surface for mounting a semiconductor, a metal member and a joining layer joining the mounting and metal members. The joining layer is composed of an adhesive sheet having a resin matrix and a filler dispersed in the matrix.

The inventor has tried to use an adhesive composition for the adhesive layer. In this case, however, the adhesive composition has fluidity and may be flown out of the joining portion when a pressure is applied. It is thus difficult to improve the flatness of the joining adhesive layer by applying a sufficient pressure. An adhesive sheet made of resin matrix is already hardened before interposed between the mounting and metal members. Such resin matrix does not pressed out from the joining layer when a pressure is applied during a heat treatment. It is thus possible to apply a sufficient pressure during the joining process and to improve the flatness of the mounting surface of the mounting member.

The adhesive sheet is made of a resin matrix, however, and has a low thermal conductivity. The adhesive sheet further has a some degree of thickness. The thermal conductivity in the joining layer may not be made sufficiently high to escape heat generated in the wafer surface through the joining layer. The temperature on the semiconductor surface may be too increased.

The inventor has reached the idea of adding a filler in the adhesive sheet. It is possible to improve the thermal conductivity of the joining layer by adding a filler in the adhesive sheet. It is thus possible to improve the flatness of the surface of the semiconductor mounting member and to control the temperature on the semiconductor surface at the same time.

Preferably, the filler is made of a material having a thermal conductivity higher than that of the resin matrix. The thermal conductivity of the adhesive sheet may be improved by adding a filler, to the matrix, made of a material having a thermal conductivity higher than that of the matrix.

Further, the Young's modulus of the adhesive sheet may preferably be not higher than 100 MPa and the elongation of the sheet may preferably be not lower than 100 percent and more preferably be not lower than 150 percent. The adhesive sheet having such improved flexibility may be effective for maintaining the air-tightness between the semiconductor mounting and metal members. The elongation or deformation of the adhesive sheet may be also effective for reducing the thermal stress. It is thus possible to prevent the warping of the joined body or peeling of the joining layer due to thermal stress after the joining process.

The elongation of the adhesive sheet is measured as follows.

An adhesive sheet having a width of 25 mm is clamped with a jig at its upper and lower ends. The distance between the clamped points at the upper and lower ends (clamp distance) is adjusted to 100 mm. The upper and lower ends are pulled at a speed of 300 mm/minute till the adhesive sheet is cut. The elongation is defined as follows.

"Elongation"=("distance between the upper and lower ends at the moment the sheets is cut" minus 100 mm)/100 mm×100 percent.

These and other objects, features and advantages of the invention will be appreciated upon reading the following description of the invention when taken in conjunction with

DETAILED DESCRIPTION OF THE INVENTION

Figure 1A:
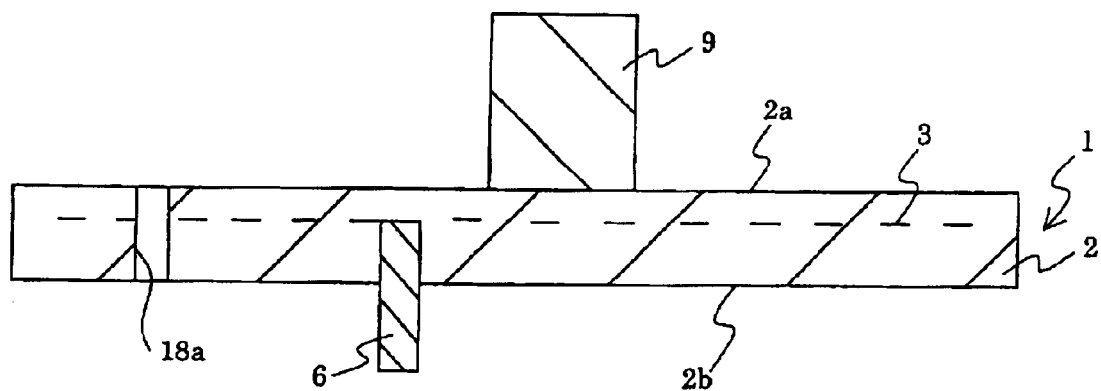
FIG. 1(a) is a cross sectional view schematically showing a semiconductor mounting member 1 used in one embodiment of the present invention.
Figure 1B:
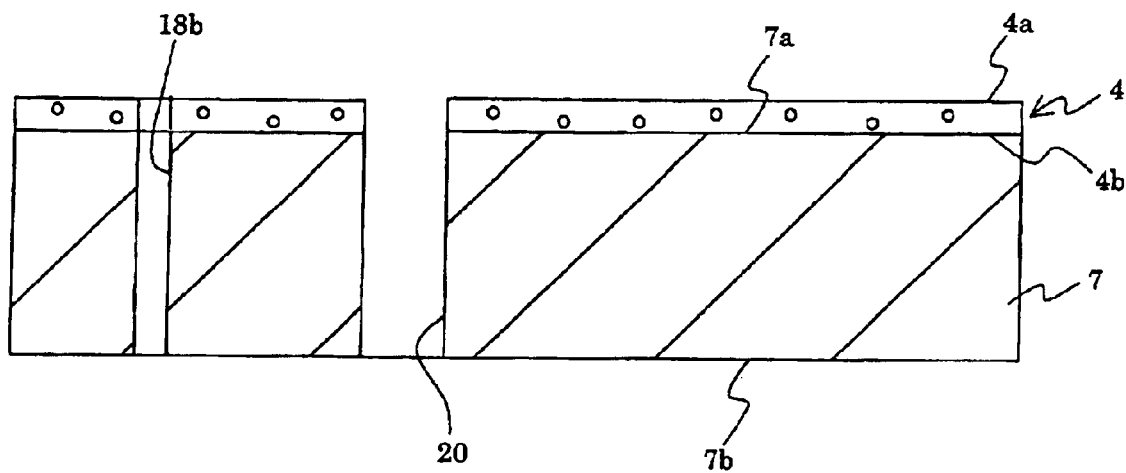
FIG. 1(b) is a cross sectional view schematically showing a metal member 7.
Figure 2:
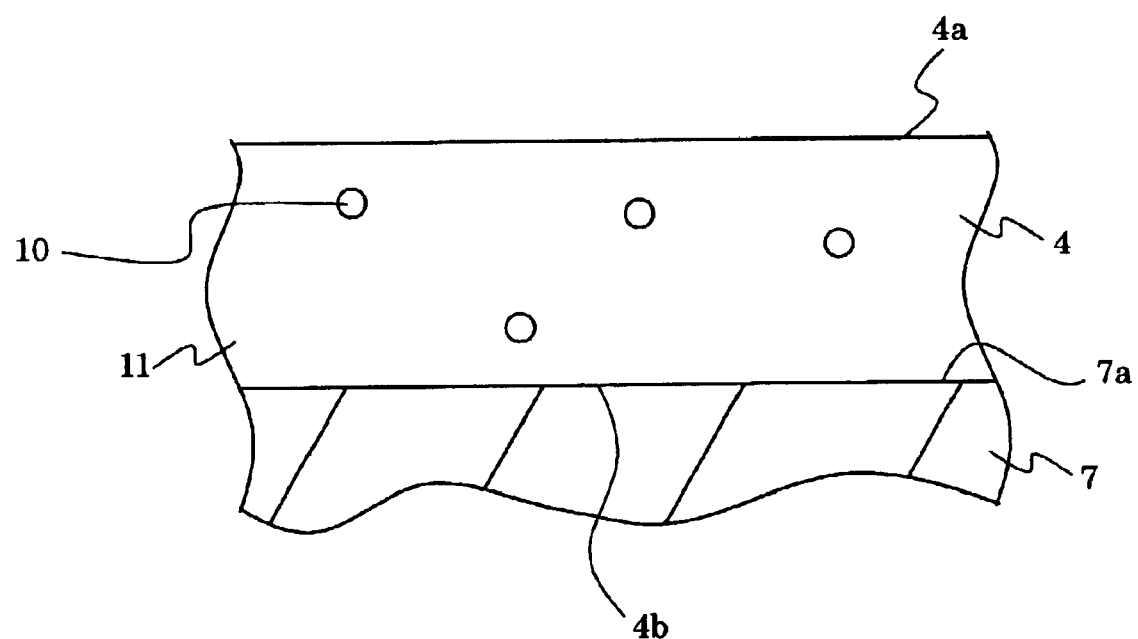
FIG. 2 is an enlarged view showing an adhesive sheet 4 joined with the metal member 7.

The present invention will be described further in detail referring to the attached drawings. FIG. 1(a) is a cross sectional view schematically showing a semiconductor mounting member 1 used in one embodiment of the present invention, and FIG. 1(b) is a cross sectional view showing a metal member 7. FIG. 2 is an enlarged view showing an adhesive sheet 4 joined with the metal member 7.

A semiconductor mounting member 1 is an electrostatic chuck, in the present embodiment, having a ceramic substrate 2 and an electrode 3 for electrostatic chuck embedded in the substrate 2. The electrode 3 is connected with a terminal 6. A semiconductor wafer is mounted and adsorbed on a adsorption face 2a of the substrate 2. A first gas supply hole 18a is formed in the mounting member 1 for supplying back side gas through the metal member for cooling a semiconductor wafer.

The metal member 7 in the present example is a cooling flange having cooling function. A second gas supply hole 18b is formed in the cooling flange 7. Back side gas such as argon gas or nitrogen gas may be supplied through the hole 18b. A terminal connecting hole 20 is provided in the metal member 7 for connecting the terminal 6 with an outer power source. Further, through holes (not shown) for lift pins for lifting a semiconductor may be provided in the cooling flange 7 and mounting member 1.

An adhesive sheet 4 is provided on either of the joining face 2b of the substrate 2 and the joining face 7a of the metal member 7. The joining face 4b is joined with the metal member 7, and the joining face 4a is joined with the substrate 2. Both of the joining faces 4a and 4b have adhesive or sticking properties. The adhesive sheet 4 has a resin matrix 11 and a filler 10 dispersed in the resin matrix 11.

The resin constituting the resin matrix may preferably be flexible and be acrylic or epoxy resin. The kind of acrylic resin is not particularly limited. Acrylic resin is generally a name of a polymer of acrylic acid or a derivative of acrylic acid. The acrylic resin includes both of a homopolymer and copolymer, and includes a cross-linked, partially cross-linked and polymers without cross linkage. The derivative of acrylic acid includes an acrylic ester, an acrylic amide, acrylonitrile, metacrylic acid and methacrylic ester. The kind of epoxy resin is not particularly limited.

The thickness of the adhesive sheet 4 may preferably be not larger than 200 μm and more preferably be not larger than 70 μm, for further improving the thermal conductivity. The thickness of the adhesive sheet 4 may preferably be not smaller than 30 μm for sufficiently utilizing the elongation.

Further, thermal cycles are applied in a process for joining the substrate 2 and metal member 7 through the adhesive sheet 4. For reducing thermal stress due to the thermal cycles, the Young's modulus of the adhesive sheet 4 may preferably be not larger than 100 MPa. On this viewpoint, the elongation of the adhesive sheet 4 may preferably be not smaller than 100 percent, more preferably be not smaller than 150 percent and most preferably be not smaller than 200 percent.

The filler 10 may preferably be made of a material having a thermal conductivity larger than that of the resin matrix, for improving the thermal conductivity of the adhesive sheet 4. The filler material includes alumina, aluminum nitride, silica and silicon carbide.

The mean particle diameter of the filler 10 may preferably be not smaller than 5 μm, for improving the thermal conductivity of the adhesive sheet 4. The mean particle diameter of the filler 10 may preferably be not larger than 50 μm.

The shape and material of the filler are not particularly limited. The shape of the filler may be, for example, particle, scale or whisker. The material of the filler may preferably be a ceramics or metal. Such ceramics includes alumina, aluminum nitride, silica and silicon carbide. The metal includes aluminum and the alloy of aluminum.

The content of the filler in the adhesive layer may preferably be not lower than 3 vol. percent and more preferably be not lower than 8 vol. percent, for improving thermal conduction in the adhesive layer. Further, the content of the filler may preferably be not higher than 50 vol. percent and more preferably be not higher than 30 vol. percent, for further improving the air-tightness and assuring the elongation of the adhesive layer.

Although the semiconductor mounting member 1 in the present embodiment is an electrostatic chuck, the member is not limited to the chuck. The semiconductor mounting member 1 may have various functions as long as it may function as a susceptor for mounting a semiconductor wafer. A heat resistor may be provided in the substrate so that the mounting member is used as a ceramic heater. Further, an electrode for generating plasma may be provided in the substrate so that the mounting member may be used as an electrode device for generating plasma.

The ceramics constituting the substrate 2 of the semiconductor mounting member 1 includes an oxide ceramics such as alumina, calcium titanate, barium titanate and a nitride ceramics. The nitride ceramics may preferably be silicon nitride or sialon for improving the resistance against thermal shock. Further, aluminum nitride is preferred on the viewpoint of corrosion resistance against a fluorine-based corrosive gas and thermal conductivity.

The material of the metal member 7 is not particularly limited. When the metal member 7 is to be exposed to a halogen based corrosive gas, the metal member may preferably be made of aluminum, copper, stainless steel, nickel or the alloys thereof.

The refrigerant used for the cooling member may be a liquid such as water, silicone oil or the like and a gas such as air, an inert gas or the like.

As shown in FIG. 1(a), the semiconductor mounting member 1 is supported with a supporting rod 9 and the joining face 2b of the mounting member 1 is opposed to the joining 7a of the metal member 7.

Figure 3:
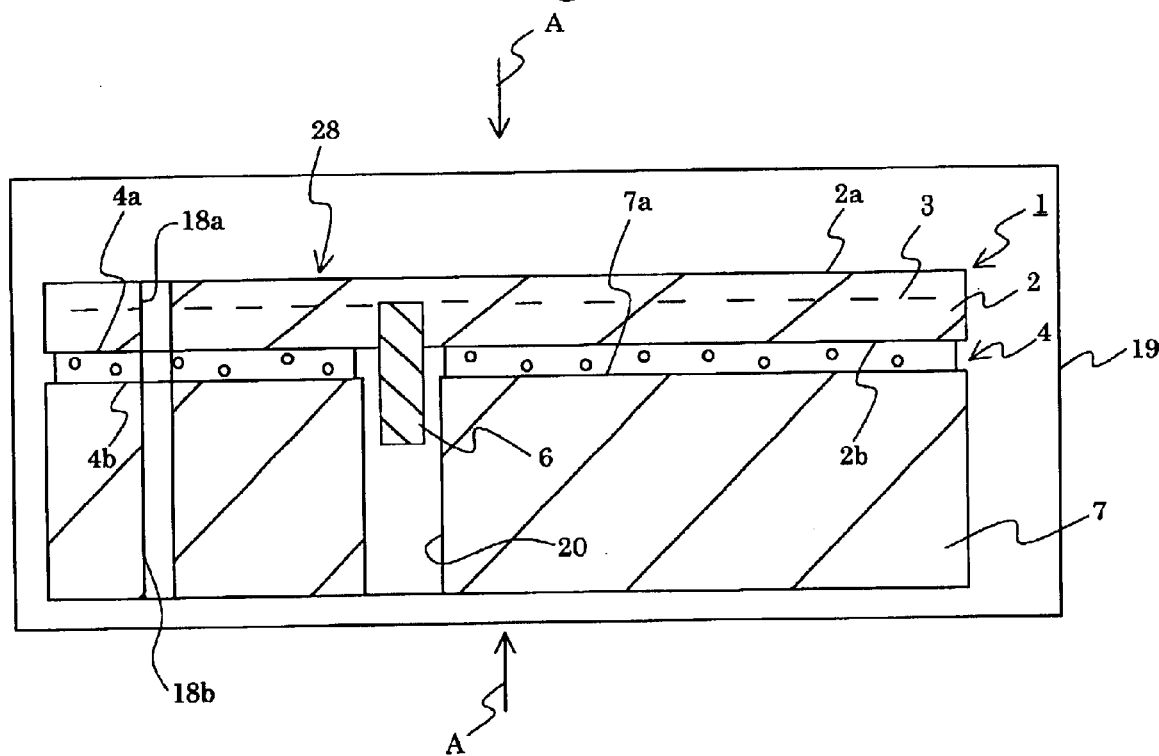
FIG. 3 is a cross sectional view schematically showing a semiconductor mounting system 12 in the manufacturing process.

The semiconductor mounting member 1 and metal member 7 are laminated to provide a laminated body 28, as shown in FIG. 3. The thus obtained laminated body 28 is then subjected to a heat treatment under pressure to join them with each other. In the step, the laminated body 28 may preferably be heated while it is subjected to isostatic pressing. The pressure is applied mainly in a direction "A" shown in FIG. 3. The methods applied for performing the heating and isostatic pressing of the body 28 are not particularly limited. Typically, as shown in FIG. 3, the laminated body 28 is vacuum packaged in a packaging film 19 and then contained in a sealed container filled with an inert gas. The vacuum packaged body is subjected to isostatic pressing with the inert gas in the sealed container. Alternatively, the laminated body may be subjected to isostatic pressing with a liquid.

The material of the film 19 is not particularly limited, as long as it has elasticity and thermal resistance at a temperature applied for heating the laminated body. The inert gas may be nitrogen, argon or a mixed gas of nitrogen and argon.

The sealed container is not particularly limited and preferably an autoclave.

Figure 6:
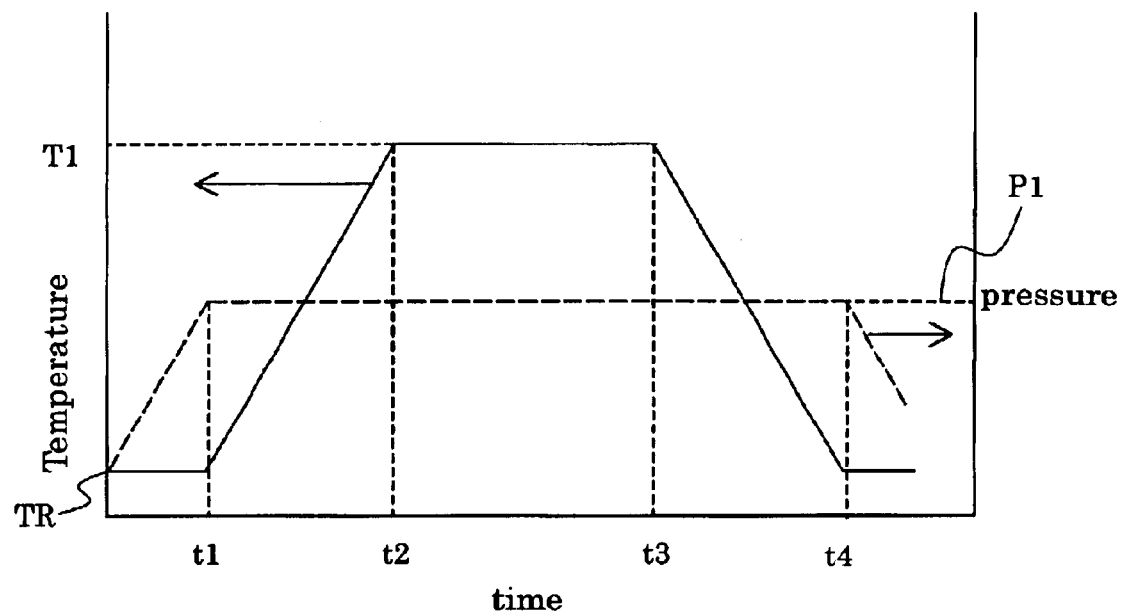
FIG. 6 is an example of a schedule of temperature and pressure during joining process.

In the present invention, it is preferred to carry out isostatic pressing when heating the laminated body at a maximum temperature during the heat treatment. That is, as shown in FIG. 6, it is needed that the pressure reaches a specified value "P1" during the maximum temperature "T1" (from the time points "t2" to "t3".)

In a preferred embodiment, the isostatic pressing is continued during a temperature reduction period after "t3" (the end of maximum temperature period). In a particularly preferred embodiment, the isostatic pressing is continued to "t4" (the end of the temperature reduction period to room temperature TR). It is thus possible to further improve the flatness of the mounting face 2a of the mounting member after the joining process.

The heating temperature T1 of the adhesive sheet 4 is not particularly limited and may preferably be not higher than 120° C. for reducing the thermal stress during the cooling step. The heating step is not required depending on the kind of the resin matrix. Alternatively, the resin matrix may be sufficiently hardened by a heat treatment at a low temperature of 60° C. or lower. It is advantageous to apply a lower temperature for the heat treatment for reducing the thermal stress due to the difference of thermal expansion between the semiconductor mounting and metal members.

The pressure P1 may preferably be not lower than 5 atm for stably joining the mounting member 1 and metal member 7 with each other.

Figure 4:
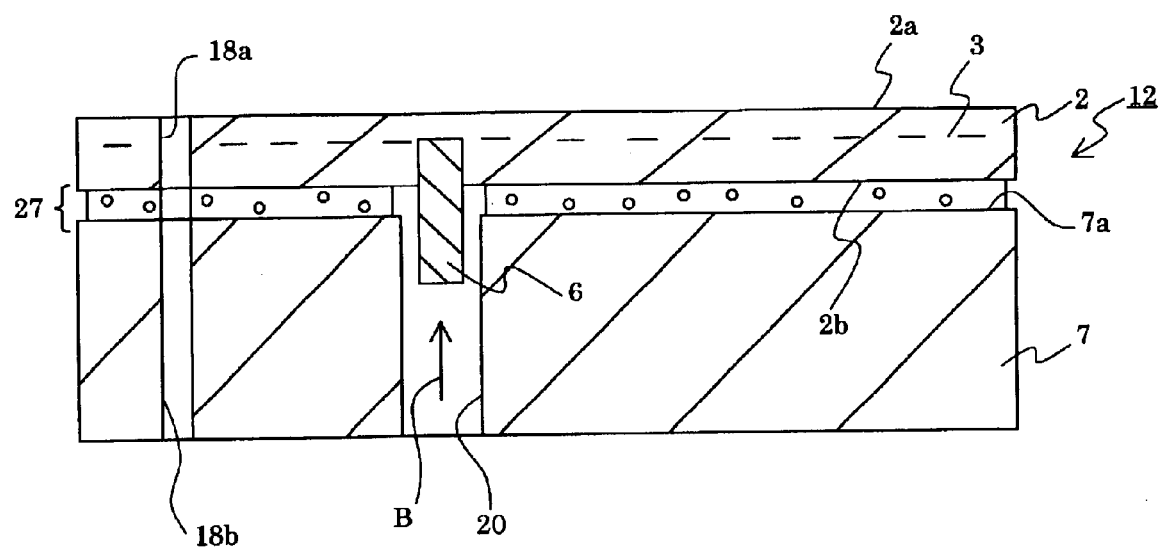
FIG. 4 is a cross sectional view schematically showing the semiconductor mounting system 12.
Figure 5:
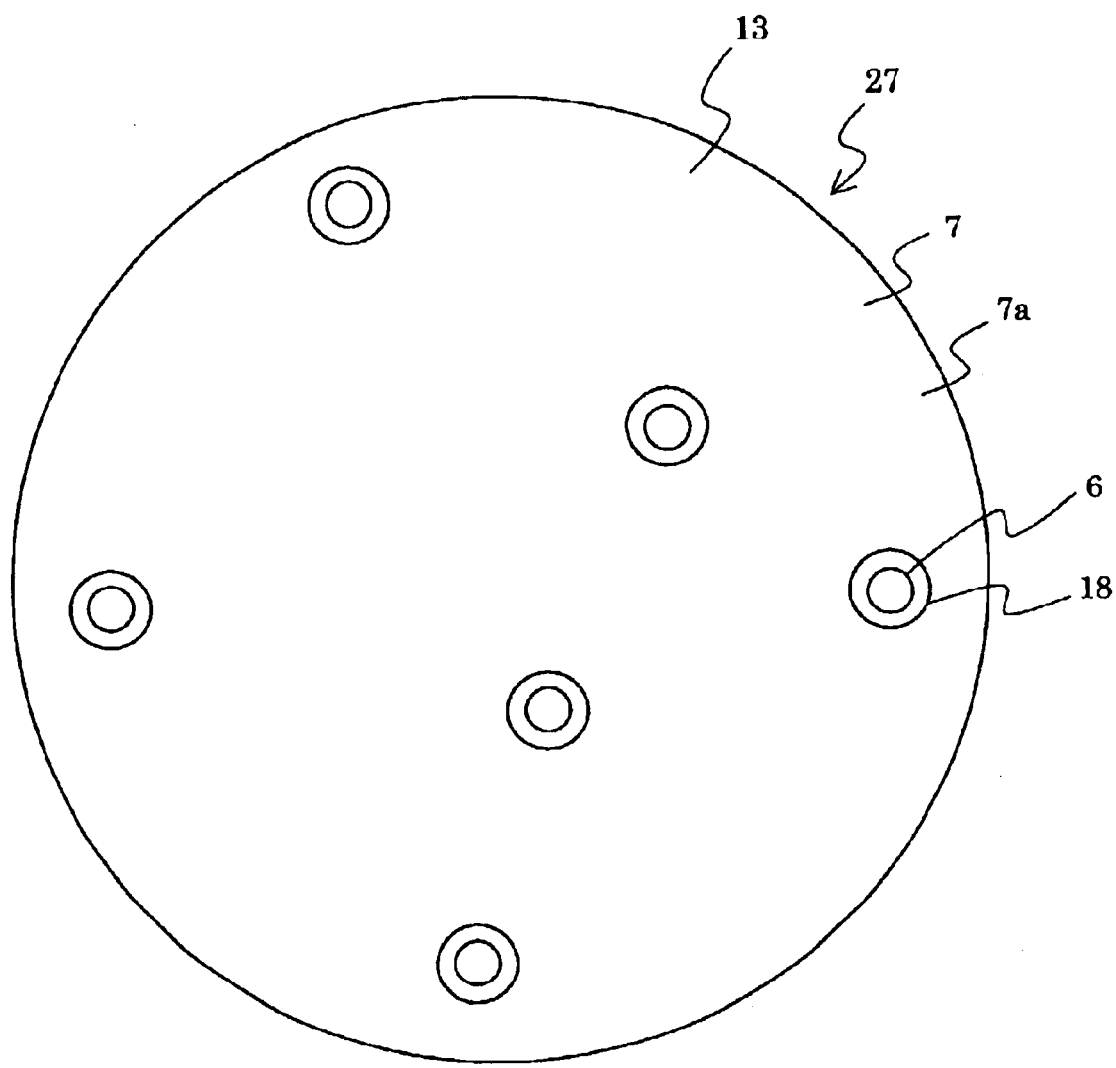
FIG. 5 is a plan view showing a joining layer 27 in the semiconductor mounting system 12 (a semiconductor mounting member 1 is omitted).

As a result, a semiconductor mounting system 12 is obtained as shown in FIG. 4. FIG. 5 is a plan view showing a joining layer 27 in the system 12 of FIG. 4, and the mounting member 1 is not shown in FIG. 5. In the system 12, the joining layer 27 joins the joining face 2b of the substrate 2 and the joining face 7a of the metal member 7.

In the present invention, the flatness of the mounting face 2a of the mounting member 1 may preferably be not larger than 30 μm and more preferably be not larger than 10 μm.

EXAMPLES

Example 1

A semiconductor mounting system 12 shown in FIGS. 4 and 5 was produced according to the procedure described above referring to FIGS. 1 to 4. Specifically, the semiconductor mounting member 1 and water cooling flange 7 were prepared. The substrate 2 for the mounting member 1 had a shape of a disk with a diameter ø of 300 mm and a thickness of 10 mm and made of aluminum nitride. An electrode 3 composed of a molybdenum mesh was embedded within the substrate 2. The water cooling flange 7 was made of the alloy of aluminum and had a shape of a disk with a diameter ø of 300 mm and a thickness of 30 mm. A water cooling groove, holes for terminals, through holes for inserting lift pins and a through hole for supplying back side gas were provided inside of the water cooling flange 7. The adsorption face 2a of the mounting member 1 had a flatness of 10 μm. Each of the joining faces 2b and 7a had a flatness of not larger than 30 μm. The mounting member 1 was subjected to ultrasonic washing with acetone, isopropyl alcohol and pure water in this order.

An adhesive sheet 4 made of acrylic resin was used. Filler composed of alumina particles having a mean diameter of 10 μm was added in the acrylic matrix resin in an amount of 10 vol. percent. The thickness of the adhesive sheet was 50 μm.

The water cooling flange 7 was set in a vacuum package and the mounting member 1 was adhered thereon to produce a laminated body 28. The laminated body 28 was vacuum packaged and contained in an autoclave 4. The laminated body was then subjected to heating and isostatic pressing at 50° C. and 14 atm for 2 hours according to the schedule shown in FIG. 6 to produce a joined body of the mounting member 1, cooling flange 7 and adhesive sheet joining the member 1 and flange 7.

Helium leakage rate and flatness of the adsorption face 2a were measured on the thus obtained mounting system 12 before and after a thermal cycle test. In one thermal cycle, the temperature was elevated from room temperature to 50° C. at a rate of 20° C./minute, maintained at 50° C. for 30 minutes and reduced from 50° C. to minus 20° C. at a rate of 20° C./minute. This cycle was repeated 50 times.

The flatness of the adsorption face 2a was measured as follows. The mounting system 12 was mounted on a surface plate with the adsorption face 2a upside. The height of each measuring point of the adsorption face 2a was measured using a height gauge. In the present measurement, the central point of the adsorption face 2a was selected as one of the measuring points. Further, 8 points were selected along an X-axis and 8 points were selected along a Y-axis on the adsorption face 2a, with both axes passing through the central point. The heights were measured for each of the selected 17 measuring points. The difference of the maximum and minimum values of the measured heights was calculated to provide a flatness.

The first supply hole 18a for back side gas was sealed and second gas supply hole 18b was used to carry out the helium leakage test. The results were shown in Table 1.

Example 2

The semiconductor mounting system 12 shown in FIGS. 4 and 5 was produced according to the procedure substantially same as the example 1. The thickness of the adhesive sheet 4 was 130 μm. 10 vol. percent of filler material composed of alumina powder having a mean particle diameter of 10 μm was added in the adhesive sheet 4. The joining process was carried out at a maximum temperature of 50° C. and a pressure of 14 kg/cm². The results were shown in table 1.

Example 3

The semiconductor mounting system 12 shown in FIGS. 4 and 5 was produced according to the procedure substantially same as the example 1. The thickness of the adhesive sheet 4 was 50 μm. 10 vol. percent of filler material composed of aluminum nitride powder having a mean particle diameter of 10 μm was added in the adhesive sheet 4. The joining process was carried out at a maximum temperature of 50° C. and a pressure of 14 kg/cm². The results were shown in table 1.

Comparative Example 1

The semiconductor mounting system 12 shown in FIGS. 4 and 5 was produced according to the procedure substantially same as the example 1. However, a polyimide tape with a thickness of 130 μm was used instead of the adhesive sheet 4. Any filler material was not added in the tape. The joining process was carried out at a maximum temperature of 120° C. and a pressure of 14 kg/cm². The results were shown in table 1.

Comparative Example 2

The semiconductor mounting system 12 shown in FIGS. 4 and 5 was produced. Silicone resin composition was used instead of the adhesive sheet 4 in the example 1. The thickness of the applied film of the composition was 80 μm. 30 vol. percent of filler material composed of alumina powder having a mean particle diameter of 10 μm was added in the composition. The steps of joining process described above of vacuum packaging the laminated body and containing the body in an autoclave were not performed. Instead of the joining process, a weight of 15 g/cm² was mounted on the laminated body while heated at 120° C. to join the mounting system and cooling flange. The results were shown in table 1.

In the examples 1, 2 and 3, the flatness of the adsorption face was excellent before and after the thermal cycle test and the helium leakage was about $2^{-10}$ Pa·m³/s. In the comparative example 1, the flatness of the adsorption face may be sufficiently improved by applying a sufficiently high pressure. However, in this case, the helium leakage rate was increased after the thermal cycle test, that is, the air-tightness was deteriorated. In the comparative example 2, the flatness of the adsorption face was not good before and after the thermal cycle test.

TABLE 1

| No. | Adhesive Material | Filler | Thickness of Adhesive layer (μm) | Filler Mean diameter |
|---|---|---|---|---|
| Example 1 | Acrylic Sheet | Alumina | 50 | 10 μm |
| Example 2 | Acrylic Sheet | Alumina | 130 | 10 μm |
| Example 3 | Acrylic Sheet | AlN | 50 | 10 μm |
| Comparative Example 1 | Polyimide Tape | None | 130 | — |
| Comparative Example 2 | Silicone | Alumina | 80 | 10 μm |

| | Conditions for Joining Process | | Wafer surface Flatness (μm) | | He leakage amount (Pa · m3/s) | |
|---|---|---|---|---|---|---|
| No. | Temperature | Pressure | Before thermal cycles | After thermal cycles | Before Thermal Cycles | After Thermal Cycles |
| Example 1 | 50° C. | 14 kg/cm2 autoclave | 30 | 30 | 2.10E-10 | 2.80E-10 |
| Example 2 | 50° C. | 14 kg/cm2 autoclave | 20 | 20 | 2.20E-10 | 2.50E-10 |
| Example 3 | 50° C. | 14 kg/cm2 autoclave | 30 | 30 | 2.30E-10 | 2.80E-10 |
| Comparative example 1 | 120° C. | 14 kg/cm2 autoclave | 15 | 20 | 3.30E-10 | 1.00E-08 |
| Comparative example 2 | 120° C. | 15 g/cm2 a weight | 110 | 120 | 4.00E-10 | 5.50E-10 |

Example 4

The joined body of disks of aluminum nitride and aluminum metal was produced with an adhesive composed of a sheet of acrylic resin. The disk made of aluminum nitride had a diameter ø of 10 mm and a thickness of 1 mm. The disk made of aluminum had a diameter ø of 10 mm and a thickness of 2 mm. The sheet of acrylic resin had a thickness of 50 μm. Filler material composed of alumina powder having a mean particle diameter of 10 μm was added in the acrylic sheet in an amount of 10 vol. percent.

The laminated body was vacuum packaged and contained in an autoclave. The laminated body was then subjected to heating and isostatic pressing at 50° C. and 14 atm for 2 hours according to the schedule shown in FIG. 6 to produce a joined body of the disks and the acrylic sheet joining them. A thermal conductivity was measured on the thus obtained joined body using laser flash method. The results were shown in table 2.

Example 5

A joined body was produced according to the substantially same procedure described in the example 4, except that the thickness of the acrylic sheet was 130 μm. The results were shown in table 2.

Comparative Example 5

A joined body was produced according to the substantially same procedure described in the example 4. However, a tape made of polyimide resin was used instead of the acrylic sheet. The thickness of the polyimide tape was 130 μm without filler material. The joining process was performed at a maximum temperature of 120° C. The results were shown in table 2.

TABLE 2

| No. | Adhesive Material | Filler | Thickness Of adhesive | Filler Mean diameter |
|---|---|---|---|---|
| Example 4 | Acrylic Sheet | Alumina | 50 μm | 10 μm |
| Example 5 | Acrylic Sheet | Alumina | 130 μm | 10 μm |
| Comparative example 3 | Polyimide Tape | None | 130 μm | — |

| | Conditions for joining process | | Thermal Conductivity |
|---|---|---|---|
| No. | Temperature | Pressure | (W/mK) |
| Example 4 | 50° C. | 14 kg/cm2 autoclave | 25 |
| Example 5 | 50° C. | 14 kg/cm2 autoclave | 14 |
| Comparative Example 3 | 120° C. | 14 kg/cm2 autoclave | 6 |

The thermal conductivity in each of the examples 4 and 5 was proved to be higher than that in the comparative example 3. Further, the thermal conductivity in the example 4 was higher than that in the example 5.

As described above, the present invention provides a novel semiconductor mounting system having a semiconductor mounting member, a metal member and a joining layer joining the mounting and metal members. According to the system, the flatness of its semiconductor mounting surface may be improved and the temperature on a semiconductor surface may be controlled.

The present invention has been explained referring to the preferred embodiments, however, the present invention is not limited to the illustrated embodiments which are given by way of examples only, and may be carried out in various modes without departing from the scope of the invention.

What is claimed is:

1. A semiconductor mounting system comprising a semiconductor mounting member having a surface for mounting a semiconductor, a metal member and a joining layer joining said mounting member and said metal member, wherein said joining layer comprises an adhesive sheet comprising a resin matrix and a filler dispersed in said resin matrix, wherein said resin matrix comprises an acrylic resin or epoxy resin, and wherein said filler is in an amount of 30 to 50 volume %.

2. The system of claim 1, wherein said filler comprises a material having a thermal conductivity higher than that of said resin matrix.

3. The system of claim 2, wherein said filler comprises at least one material selected from the group consisting of alumina, aluminum nitride, silica and silicon carbide.

4. The system of claim 1, wherein said filler comprises a powder having a mean particle diameter of not smaller than 5 μm.

5. The system of claim 1, wherein said adhesive sheet has a Young's modulus of 1 to 100 MPa.

6. The system of claim 1, wherein said adhesive sheet has an elongation of 100 to 200 percent.

7. A semiconductor mounting system comprising a semiconductor mounting member having a surface for mounting a semiconductor, a metal member and a joining layer joining said mounting member and said metal member, wherein said joining layer comprises an adhesive sheet comprising a resin matrix and a filler dispersed in said resin matrix, wherein said adhesive sheet has a Young's modulus of 1 to 100 MPa and wherein said adhesive sheet has an elongation of 100 to 200%.

* * * * *

UNITED STATES PATENT AND TRADEMARK OFFICE
CERTIFICATE OF CORRECTION

PATENT NO. : 6,831,307 B2
DATED : December 14, 2004
INVENTOR(S) : Tomoyuki Fujii It is certified that error appears in the above-identified patent and that said Letters Patent is hereby corrected as shown below:

<u>Title page,</u>
Item [56], References Cited, FOREIGN PATENT DOCUMENTS, add
-- JP 04-287344  10/1992
  JP 09-045757  02/1997
  JP 2000-183143  06/2000 --

Signed and Sealed this

First Day of March, 2005

JON W. DUDAS
*Director of the United States Patent and Trademark Office*